United States Patent
Kim et al.

(10) Patent No.: US 8,455,282 B2
(45) Date of Patent: Jun. 4, 2013

(54) METHOD OF MANUFACTURING VERTICAL LIGHT EMITTING DIODE WITH DUAL SURFACE PATTERN TO IMPROVE LIGHT EXTRACTION

(75) Inventors: Ki Sung Kim, Gyunggi-do (KR); Gi Bum Kim, Gyunggi-do (KR); Tae Hun Kim, Gyunggi-do (KR); Young Chul Shin, Seoul (KR); Young Sun Kim, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 102 days.

(21) Appl. No.: 13/162,254

(22) Filed: Jun. 16, 2011

(65) Prior Publication Data
US 2012/0001152 A1 Jan. 5, 2012

(30) Foreign Application Priority Data
Jul. 1, 2010 (KR) .................. 10-2010-0063525

(51) Int. Cl.
*H01L 21/00* (2006.01)

(52) U.S. Cl.
USPC .................. 438/42; 438/29; 438/34; 438/46; 438/47; 438/38; 257/98; 257/E33.067; 257/E33.074

(58) Field of Classification Search
USPC ................ 438/42, 44; 257/E33.074
See application file for complete search history.

(56) References Cited

U.S. PATENT DOCUMENTS
2006/0225644 A1* 10/2006 Lee et al. .................. 117/89
2007/0018187 A1* 1/2007 Lee et al. .................. 257/98

FOREIGN PATENT DOCUMENTS
KR 10-2008-0015192 A 2/2008
* cited by examiner

*Primary Examiner* — Howard Weiss
*Assistant Examiner* — Cesar Lopez
(74) *Attorney, Agent, or Firm* — McDermott Will & Emery LLP

(57) ABSTRACT

A semiconductor light emitting diode (LED) and a manufacturing method thereof are disclosed. The method for manufacturing a semiconductor light emitting diode (LED) includes: forming a light emission structure including a first conductive semiconductor layer, an active layer, and a second conductive semiconductor layer on a substrate with prominences and depressions; removing the substrate from the light emission structure to expose a first concavoconvex portion corresponding to the prominences and depressions; forming a protection layer on the first concavoconvex portion; removing a portion of the protection layer to expose a convex portion of the first concavoconvex portion; and forming a second concavoconvex portion on the convex portion of the first concavoconvex portion. The semiconductor light emitting diode (LED) includes: a light emission structure including a first conductive type semiconductor layer, an active layer, and a second conductive type semiconductor layer; a first concavoconvex portion formed on the light emission structure and having a second concavoconvex portion at a convex portion thereof; and a protection layer filling up a concave portion of the first concavoconvex portion.

14 Claims, 3 Drawing Sheets

METHOD OF MANUFACTURING VERTICAL LIGHT EMITTING DIODE WITH DUAL SURFACE PATTERN TO IMPROVE LIGHT EXTRACTION

CROSS-REFERENCE TO RELATED APPLICATIONS

This application claims the priority of Korean Patent Application No. 10-2010-0063525 filed on Jul. 1, 2010, in the Korean Intellectual Property Office, the disclosure of which is incorporated herein by reference.

BACKGROUND OF THE INVENTION

1. Field of the Invention

The present invention relates to a semiconductor light emitting diode and a manufacturing method thereof and, more particularly, to a semiconductor light emitting diode having improved crystallinity and efficiency in extracting external light, and a manufacturing method thereof.

2. Description of the Related Art

In general, a light emitting diode (LED) is an element used to transmit a signal obtained by converting electric energy into energy in the form of infrared rays, visible light, or light, by using the characteristics of a compound semiconductor. The LED produces a sort of electroluminescence, and currently, an LED using a III-V compound semiconductor has been put to practical use (or has been commercialized). III nitride-based compound semiconductor is a direct transition type semiconductor, and because it can obtain a stabilized operation at a high temperature compared with an element using different semiconductor, the III nitride-based compound semiconductor is commonly applied to a light emitting element such as the LED, a laser diode (LD), or the like.

The III nitride-based compound semiconductor is generally formed on a substrate made of sapphire. However, the use of an insulating substrate such as the sapphire substrate greatly restricts the arrangement of electrodes. Namely, in the conventional nitride semiconductor LED, because electrodes are generally arranged in a horizontal direction, a current flow becomes narrow. The narrow current flow increases an operational voltage Vf of the LED, degrading current efficiency, and the LED is therefore vulnerable to electrostatic discharge. Thus, in an effort to solve the problem, a semiconductor LED in which electrodes are arranged in a vertical direction is studied.

Research into the semiconductor LED having such a vertical electrode structure is being conducted to improve the luminous efficiency, namely, the light extraction efficiency, of the semiconductor LED by forming a prominence and a depression structure on a light extraction area of the LED. The passage of light is limited in the interface of material layers because the material layers have different respective indexes of refraction. In the case of a smooth interface, when light goes from a semiconductor layer having a large index of refraction (n>1) toward an air layer having a small index of refraction (n=1), the light must be made incident to the smooth interface at below a certain angle (threshold angle) or smaller. The reason for this is because if the light is made incident at the certain angle or greater, light would be totally reflected from the smooth interface, significantly reducing light extraction efficiency. Thus, in order to solve this problem, a method of introducing a prominence and depression structure on the interface has been attempted.

One of the methods for introducing a prominence and depression structure on the interface is that a nitride semiconductor layer is stacked on a sapphire substrate with prominences and depressions and a prominent and depressed surface exposed by removing the sapphire substrate is used as a light extraction surface. However, in this method, when a semiconductor layer is formed on a growth substrate such as the sapphire substrate, the semiconductor layer may easily become defective due to the difference in a crystal constant between the substrate and the semiconductor layer, and when an additional prominent and depressed portion is formed on the semiconductor layer with the prominence and depression patterns already formed thereon through wet etching, an etchant (or an etching solution), and the like, is bound to flow to the defective portion, degrading the quality of the semiconductor layer and creating a defective product.

SUMMARY OF THE INVENTION

An aspect of the present invention provides a method for manufacturing a semiconductor light emitting diode (LED) capable of preventing a leakage of an etchant into a defective portion in the interior of a semiconductor layer in the process of forming a prominent and depressed surface, to thus improve the quality of a semiconductor LED, and a semiconductor LED having a maximized efficiency in extracting external light by forming a dual-pattern.

According to an aspect of the present invention, there is provided a method for manufacturing a semiconductor light emitting diode (LED), including: forming a light emission structure including a first conductive semiconductor layer, an active layer, and a second conductive semiconductor layer on a substrate with prominences and depressions; removing the substrate from the light emission structure to expose a first concavoconvex portion corresponding to the prominences and depressions; forming a protection layer on the first concavoconvex portion; removing a portion of the protection layer to expose a convex portion of the first concavoconvex portion; and forming a second concavoconvex portion on the convex portion of the first concavoconvex portion.

The method may further include: coating a photoresist on the surface of the protection layer to planarize the surface.

The removing of a portion of the protection layer may be removing of the photoresist and a portion of the protection layer to expose the convex portion of the first concavoconvex portion.

The removing of the photoresist and a portion of the protection layer may be performed through wet etching.

In the removing of a portion of the protection layer, only the convex portion of the first concavoconvex portion may be exposed.

The size of the patterns of the second concavoconvex portion may be smaller than that of the patterns of the first concavoconvex portion.

The removing of a portion of the protection layer may be performed by one of chemical mechanical polishing (CMP), wet etching, and dry etching.

The forming of the second concavoconvex portion may be performed through wet etching.

The wet etching may be performed by using a KOH solution.

The method may further include: removing the protection layer remaining in a concave portion of the first concavoconvex portion after the forming of the second concavoconvex portion.

The removing of the protection layer remaining in the concave portion of the first concavoconvex portion may be performed through a wet etching process using an HF solution.

The removing of the substrate may be performed through a laser lift-off process.

The protection layer may include at least one of silicon oxide and silicon nitride.

The forming of the protection layer may be performed by at least one of sputtering and a deposition process.

According to another aspect of the present invention, there is provided a semiconductor light emitting diode (LED) including: a light emission structure including a first conductive type semiconductor layer, an active layer, and a second conductive type semiconductor layer; a first concavoconvex portion formed on the light emission structure and having a second concavoconvex portion at a convex portion thereof; and a protection layer filling up a concave portion of the first concavoconvex portion.

The first concavoconvex portion may be formed on a surface of at least one of the first and second conductive type semiconductor layers.

The protection layer may include at least one of silicon nitride and silicon oxide.

The first concavoconvex portion may have periodical patterns and the second concavoconvex portion may have non-periodical patterns.

The size of the patterns of the second concavoconvex portion may be smaller than that of the patterns of the first concavoconvex portion.

The first and second conductive type semiconductor layers may be n and p type semiconductor layers, respectively, and the first concavoconvex portion may be formed on the n type semiconductor layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
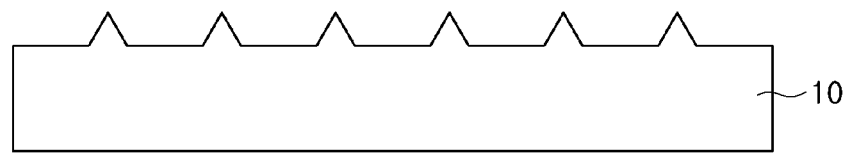
FIGS. 1 to 8 are views illustrating a method for manufacturing a semiconductor light emitting diode (LED) according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIGS. 1 to 8 are views illustrating a method for manufacturing a semiconductor light emitting diode (LED) according to an exemplary embodiment of the present invention.

As shown in FIG. 1, a substrate 10 having a prominence and depression structure formed on a surface thereof is prepared. The substrate 10 may be made of a material such as sapphire, SiC, $MgAl_2O_4$, MgO, $LiAlO_2$, $LiGaO_2$, GaN, or the like. In this case, sapphire, a crystal having Hexa-Rhombo R3c symmetry, have lattice constants of 13,001 Å and 4.758 Å, respectively, in c-axis and a-axis directions and have C(0001), A(1120), and R(1102) planes, etc. In this case, the C plane allows a nitride thin film to be relatively easily grown therefrom and is stable at a high temperature, so it is largely used as a growth substrate. In order to reduce a lattice defect of the growth substrate 10 and a nitride semiconductor layer formed on the growth substrate 10, a buffer layer (not shown) may be formed on the growth substrate 10. The buffer layer may be employed as an undoped semiconductor layer made of nitride, or the like, in order to reduce a lattice defect of a light emission structure grown thereon.

The prominence and depression structure of the substrate 10 may be formed by selectively etching a portion of the substrate 10 by using a photoresist pattern as an etching mask, thus forming prominence and depression patterns having a regular or irregular period. In detail, in etching a portion of the substrate by using the mask, a wet etching method using a BOE solution as an etchant may be used or a RIE dry etching method may be used. In the wet etching process for forming the patterns, one of hydrochloric acid (HCl), nitric acid ($HNO_3$), hydrofluoric acid (HF), potassium hydroxide (KOH), sodium hydroxide (NaOH), sulphuric acid ($H_2SO_4$), phosphoric acid ($H_3PO_4$), and $4H_3PO_4 + 4CH_3COOH + HNO_3 + H_2$, or a mixture solution of any of their combinations may be used as an etchant. In this case, the etchant may be used in a state of being heated at a temperature of 100° C. or higher. Meanwhile, the dry etching may be performed by using an etchant gas among at least one of $BCL_3$, $Cl_2$, HBr, and Ar, and in etching the substrate 10, dry etching and wet etching may be performed in conjunction.

Figure 2:
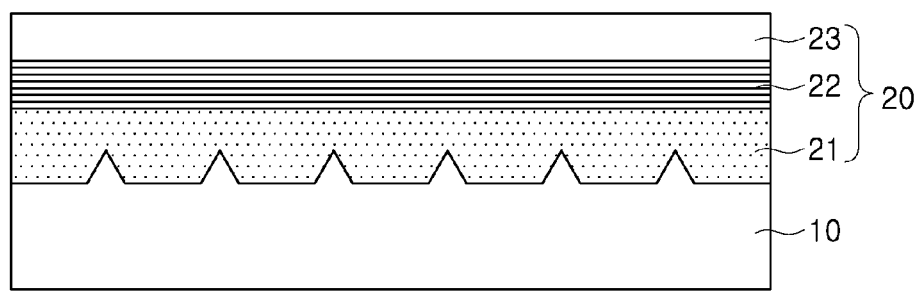

With reference to FIG. 2, a light emission structure 20 including a first conductive type semiconductor layer 21, an active layer 22, a second conductive type semiconductor layer 23 may be formed on the substrate 10 having the prominence and depression patterns. The first and second conductive type semiconductor layers 21 and 23 constituting the light emission structure 20 may be n type and p type semiconductor layers and formed of nitride semiconductors, respectively. Thus, in the present exemplary embodiment, the first and second conductive type semiconductor layers may be understood to denote n type and p type semiconductor layers, respectively. The first and second conductive type semiconductor layers 21 and 23 may have an empirical formula $Al_x In_y Ga_{(1-x-y)}N$ (Here, $0 \leq x \leq 1$, $0 \leq y \leq 1$, $0 \leq x+y \leq 1$), and made be made of, for example, a material such as GaN, AlGaN, InGaN, or the like. The active layer 22 formed between the first and second conductive type semiconductor layers 21 and 23 may emit light having a certain amount of energy, according to recombination of electrons and holes, and may have a multi-quantum wall (MQW) structure, e.g., an InGaN/GaN structure, in which quantum wall layers and quantum barrier layers are alternately stacked. Meanwhile, the first and second conductive type semiconductor layers 21 and 23 and the active layer 22 may be formed by using a semiconductor layer growth process such as MOCVD, MBE, HVPE, and the like, known in the art.

Figure 3:
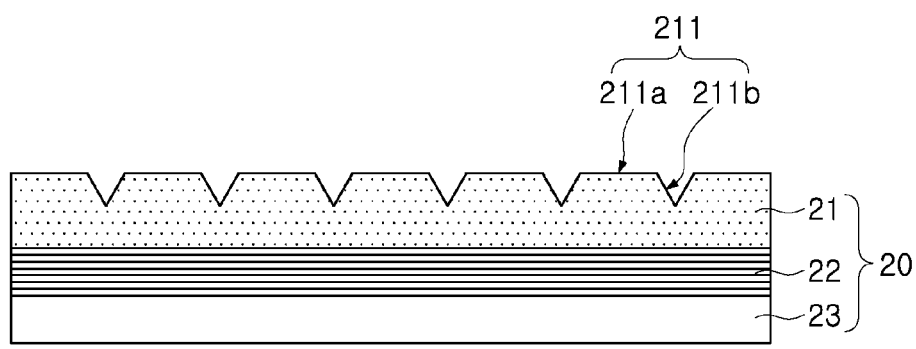

Thereafter, as shown in FIG. 3, the substrate 10 having the prominence and depression patterns may be removed. Although not shown, a conductive substrate may be bonded to an upper surface of an upper surface of the light emission structure, specifically, to an upper surface of the second conductive type semiconductor layer 23, and after the conductive substrate is bonded, the growth substrate 10 may be removed by using a laser lift-off process, or the like. The conductive substrate (not shown) may serve as a support supporting the light emission structure 20 when the lift-off process, or the like, is performed to remove the semiconductor growth substrate 10 and may be formed as any one of a semiconductor substrate material such as Si, GaAs, InP, InAs, or the like, a conductive oxide layer such as ITO (Indium Tin Oxide), ZrB, ZnO, or the like, and a metal substrate such as CuW, Mo, Au. Al, Au, or the like. In the present exemplary embodiment, the conductive substrate may be bonded to the light emission structure 20 by the medium of a conductive bonding layer, and in this case, the conductive bonding layer may be made of a eutectic metal material such as AuSn. Also, the conductive substrate may be formed through electroplating, electroless plating, thermal evaporator, e-beam evaporator, sputter, chemical vapor deposition (CVD), and the like.

In the present exemplary embodiment, the growth substrate 10 may be removed through a process such as laser lift-off, chemical lift-off, or the like, by using the conductive substrate as a support, and the conductive substrate may serve as an electrode of the second conductive type semiconductor layer 23. A reflection electrode layer (not shown) may be interposed between the conductive substrate and the second conductive type semiconductor layer 23. The reflection electrode layer may serve to reflect light, which is emitted from the active layer of the light emission structure 20, toward an upper portion of the light emission structure 20, namely, toward the first conductive type semiconductor layer 21. The reflection electrode layer may be in ohmic-contact with the first conductive type semiconductor layer 21. In consideration of this function, the reflection metal layer may include a material such as Ag, Ni, Al, Rh, Pd, Ir, Ru, Mg, Zn, Pt, Au, and the like.

Although not shown, the reflection metal layer may be employed to have a structure having dual or more layers to improve a reflection efficiency thereof. For example, the reflection metal layer may be formed as Ni/Ag, Zn/Ag, Ni/Al, Zn/Al, Pd/Ag, Pd/Al, Ir/Ag. Ir/Au, Pt/Ag, Pt/Al, Ni/Ag/Pt, and the like. However, the reflection metal layer is not requisite for the present exemplary embodiment, which, thus, may not be included.

In the step of removing the growth substrate 10 and the buffer layer (not shown), at least any one of a wet etching method using any one of hydrochloric acid (HCl), nitric acid ($HNO_3$), hydrofluoric acid (HF), potassium hydroxide (KOH), sodium hydroxide (NaOH), sulphuric acid ($H_2SO_4$), phosphoric acid ($H_3PO_4$), and $4H_3PO_4+4CH_3COOH+HNO_3+H_2$, or a mixture solution of any of their combinations, chemical mechanical polishing, and an ICP/RIE dry etching method may be used. Alternatively, the wet etching method and the dry etching method may be used together; the wet etching method for etching the growth substrate and the dry etching method for etching the buffer layer.

FIG. 3 shows a light emission structure 20 in a state in which the growth substrate 10 has been removed therefrom. The light emission structure 20 includes the first conductive type semiconductor layer 21 having a first concavoconvex portion 211, the active layer 22, and the second conductive type semiconductor layer 23. The first conductive type semiconductor layer 21 includes the first concavoconvex portion 211 having such a shape as to be engaged with the prominence and depression pattern of the substrate 10. The first concavoconvex portion 211 includes a convex portion 211a and a concave portion 211b.

Figure 4:
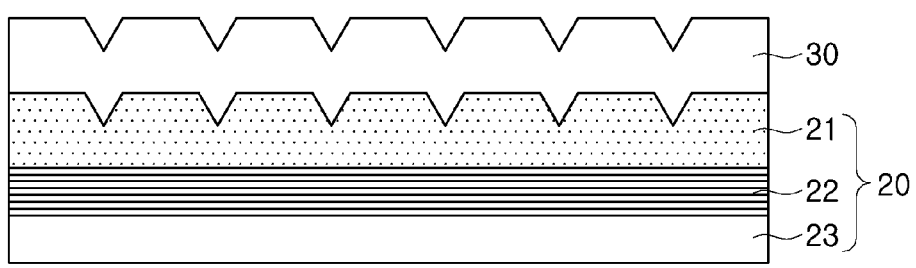

Thereafter, a protection layer 30 may be formed as shown in FIG. 4. The protection layer 30 may serve to prevent an etchant from infiltrating into a portion (dislocation bundle) of the first conductive type semiconductor layer 21 where a crystal defect is generated in a follow-up additional patterning formation process, to thus manufacture a high quality semiconductor LED. When the semiconductor layer is formed on the growth substrate such as the sapphire substrate like in the present exemplary embodiment, the semiconductor layer may become easily defective due to the difference in crystal constant between the substrate and the semiconductor layer. Then, when additional prominences and depressions are formed on the semiconductor layer having the prominence and depression patterns through wet etching, and the like, the etchant, or the like, would flow into the defective portion to degrade the quality of the semiconductor layer and cause a defective product. However, the formation of the protection layer 30 on the first semiconductor layer 21 having the first concavoconvex portion 211 according to the present exemplary embodiment can prevent the infiltration of the etchant through the defective area of the first semiconductor layer 21 in the additional prominence and depression formation process.

The protection layer 30 may be made of an organic or inorganic compound having different physical properties to those of GaN. In detail, the protection layer 30 may be made of silicon oxide such as $SiO_2$, a silicon nitride such as SiNx, $Al_2O_3$, HfO, $TiO_2$, ZrO, ZnO, indium oxide including an additive of at least one of Mg, Ag, Xn, Sc, Hf, Wr, Te, Se, Ta, W, Nb, Cu, Si, ni, Co, Mo, Cr, Mn, Hg, Pr and La, through a process such as sputtering, deposition, or the like, known in the art.

Figure 5:
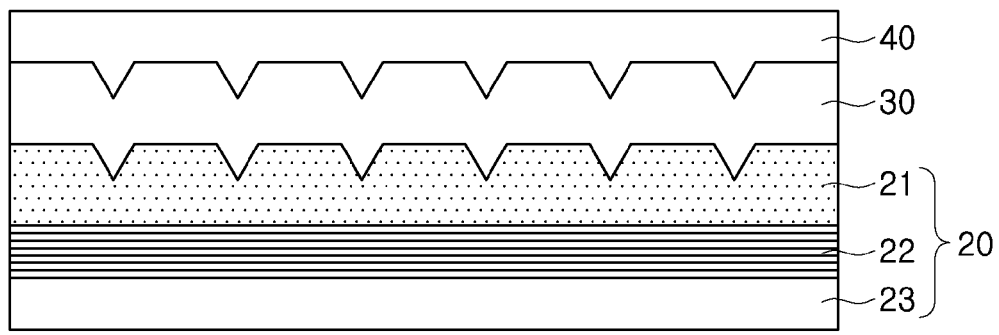

Thereafter, as shown in FIG. 5, photoresist may be coated on the protection layer 30 to form a photoresist layer 40. With reference to FIG. 5, the protection layer is formed on the first conductive type semiconductor layer 21 through the process such as deposition, sputtering, or the like, the same prominence and depression patterns as those of the first concavoconvex 211 formed on the first conductive type semiconductor layer 21 are formed on the surface of the protection layer 30. Thus, in order to planarize the surface of the protection layer 30, the photoresist layer 40 may be formed on the surface of the protection layer 30. The photoresist layer 40 has the qualities that a photosensitive portion thereof is not dissolved (negative type) or dissolved (positive type) by a developer through light irradiation. Any (in general, an organic polymer) of the components of the photoresist layer 40 is dissolved by an organic solvent. The photoresist layer 40 may be made of a material having weaker viscosity than that of the protection layer 30, and thus, the photoresist layer 40 fills up the concave portions of the prominences and depressions formed on the surface of the protection layer 30 to provide a smooth (or planarized) surface.

The step illustrated in FIG. 5 is performed to provide a smooth surface in the process of exposing a portion of the first conductive type semiconductor layer 21 by removing the protection layer 30, and in this case, when a portion of the protection layer 30 is removed through dry etching or chemical mechanical polishing, the step of coating the photoresist layer 40 is not required. Thus, the step illustrated in FIG. 5 may be omitted depending on the type of the process of removing the protection layer 30.

Figure 6:
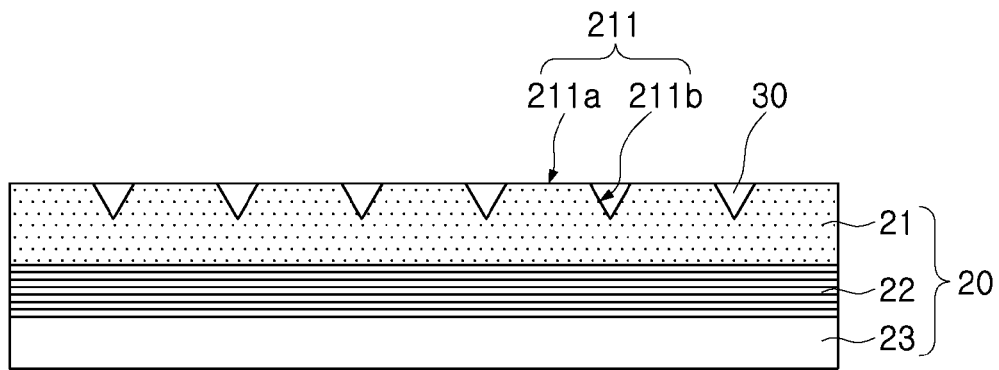

Then, as shown in FIG. 6, the photoresist layer 40 and a portion of the protection layer 30 are etched to expose a portion of the first conductive semiconductor layer 21. In detail, the photoresist layer 40 and the protection layer 30 may be sequentially etched until such time as the convex portion 211a of the first concavoconvex portion 211 formed on the first conductive type semiconductor layer 21 is exposed. When the photoresist layer 40 is not formed, the surface of the protection layer 30 may be planarized by using a chemical mechanical polishing (CMP) process, and when the photoresist layer 40 is formed on the protection layer 30 and the surface is polarized, the photoresist layer 40 may be etched by using an etching process, e.g., ICP-RIE, and the like, known in the art.

Figure 7:
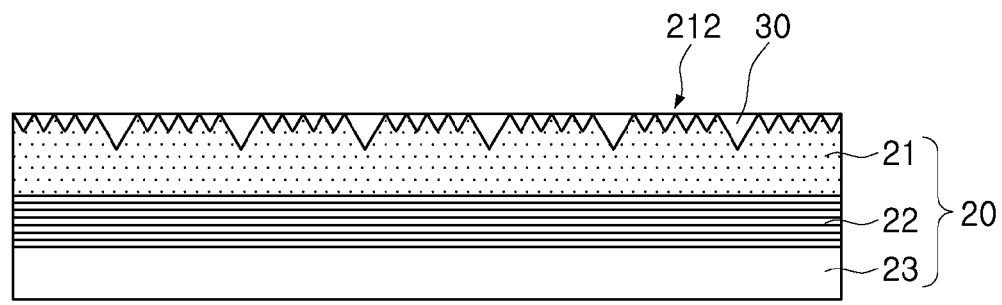

Thereafter, as shown in FIG. 7, a second concavoconvex portion 212 is formed on the exposed convex portion 211a of the first concavoconvex portion 211 formed on the first conductive type semiconductor layer 21. The second concavoconvex portion 212 is additionally formed on the convex portion 211a of the first concavoconvex portion 211 to increase the surface area of the first conductive type semiconductor layer 21, thus increasing efficiency in extracting external light. The first and second concavoconvex portions 211 and 212 may have regular or irregular patterns. When the first concavoconvex portion 211 has patterns of a regular period and the second concavoconvex portion 212 has patterns of an irregular period, a light extraction distribution of the periodic first concavoconvex portion 211 can be improved and the non-periodic second concavoconvex portion 212 is diffused-reflected to thus increase efficiency in extracting external light. The first and second concavoconvex portions 211 and 212 serve to effectively emit photons by improving the diffusion characteristics of the photons generated from the active layer 22 of the light emission structure 20 to effectively emit the photons to the outside. In the present exemplary embodiment, the side has a triangular shape, but the present invention is not limited thereto and the side may have various other shapes such as a hemispheric shape, a quadrangular shape, a trapezoid shape, or the like.

The second concavoconvex portion 212 formed on the convex portion 211a of the first concavoconvex portion 211 may be formed through a wet etching process using an etchant such as KOH. The wet etching process may be performed by using an etchant such as KOH, $H_3PO_4$, or the like, and through this process, the second concavoconvex portion 212 having an irregular period may be formed on the convex portion of the first concavoconvex portion 211. In this case, however, the process of forming the second concavoconvex portion 212 is not limited to the wet etching method, and a dry etching method using ICP-RIE, or the like, may be used, or wet etching and dry etching may be performed in conjunction.

In the present exemplary embodiment, the efficiency in extracting external light can be maximized owing to the presence of the first and second concavoconvex portions 211 and 212 formed on the first conductive type semiconductor layer 21. The protection layer 30 remaining within the concave portion 211b of the first concavoconvex portion 211 may be made of a material having a high light transmittance and the index of refraction of 2.5 or lower to extract light, which has been emitted from the active layer 22 of the light emission structure 20, to the outside to thus improve efficiency in extracting external light.

Figure 8:
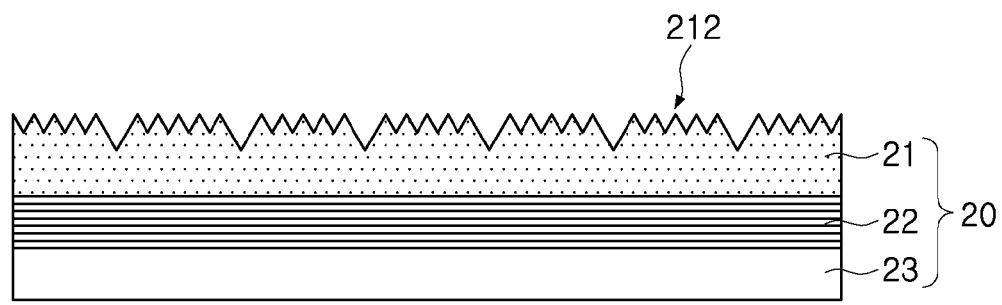

Thereafter, as shown in FIG. 8, the protection layer 30 remaining in the concave portion 211b of the first concavoconvex portion 211 is wet-etched by using an etchant such as HF to allow the surfaces of the first and second concavoconvex portions 211 and 212 to be entirely exposed in the air. However, the process illustrated in FIG. 8 may not be requisite; the protection layer 30 remaining within the concave portion 211b of the first concavoconvex portion 211 may be left as it is, or may be selectively removed as shown in FIG. 8.

Figure 9:
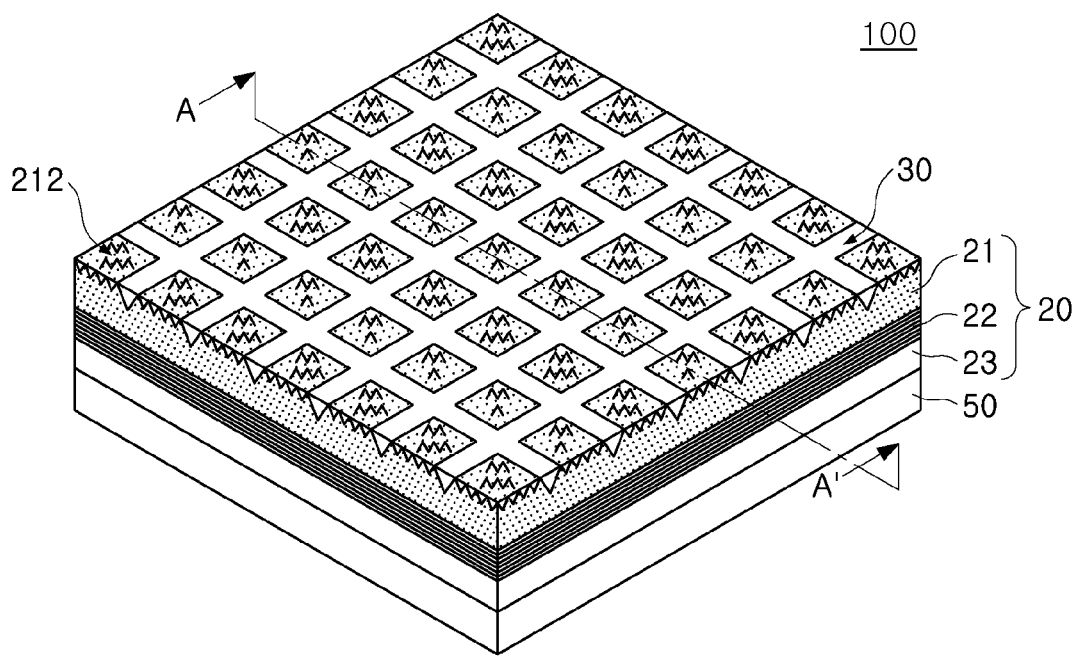
FIG. 9 is a perspective view schematically showing the semiconductor LED according to an exemplary embodiment of the present invention.

FIG. 9 is a perspective view schematically showing the semiconductor LED according to an exemplary embodiment of the present invention. With reference to FIG. 9, a semiconductor LED according to the present exemplary embodiment includes the light emission structure 20 including the active area 22 formed on a conductive substrate 50, the first concavoconvex portion 211 having a plurality of convex portions 211a formed on the light emission structure 20, and the second concavoconvex portion 212 formed on the plurality of convex portions 211a. The light emission structure 20 may be formed by sequentially stacking the first conductive type semiconductor layer 21, the active layer 22, and the second conductive type semiconductor layer 23.

In the present exemplary embodiment, the first and second conductive type semiconductor layers 21 and 23 constituting the light emission structure 20 may be n type and p type semiconductor layers and formed of nitride semiconductor, respectively. Thus, in the present exemplary embodiment, the first and second conductive type semiconductor layers may be understood to denote n type and p type semiconductor layers, respectively. The first and second conductive type semiconductor layers 21 and 23 may have an empirical formula $Al_xIn_yGa_{(1-x-y)}N$ (Here, $0 \leq x \leq 1$, $0 \leq y \leq 1$, $0 \leq x+y \leq 1$), and made be made of, for example, a material such as GaN, AlGaN, InGaN, and the like. The active layer 22 formed between the first and second conductive type semiconductor layers 21 and 23 may emit light having certain energy according to recombination of electrons and holes, and may have a multi-quantum wall (MQW) structure, e.g., an InGaN/GaN structure, in which quantum wall layers and quantum barrier layers are alternately stacked. Meanwhile, the first and second conductive type semiconductor layers 21 and 23 and the active layer 22 may be formed by using a semiconductor layer growth process such as MOCVD, MBE, HVPE, and the like, known in the art.

A conductive substrate 50 may serve as a support supporting the light emission structure 20 when the lift-off process, or the like, is performed to remove a semiconductor growth substrate (not shown) and may be made of a material including any one of Au, Ni, Al, Cu, W, Si, Se, GaAs. For example, the conductive substrate 50 may be formed by doping aluminum (Al) on a silicon substrate. In the present exemplary embodiment, the conductive substrate may be bonded to the light emission structure by the medium of a conductive bonding layer (not shown), and in this case, the conductive bonding layer may be made of a eutectic metal material such as AuSn.

The first concavoconvex portion 211 having the plurality of convex portions 211a and concave portions 211b may be formed on the surface of the first conductive type semiconductor layer 21 and have periodical or non-periodical patterns. The first concavoconvex portion 211 formed on the surface of the first conductive type semiconductor layer 21 may be formed by performing etching, such as dry etching or wet etching, on the surface of the first conductive type semiconductor layer 21, or may be formed on the growth substrate having the prominence and depression structure and the growth substrate is removed to form a prominence and depression structure engaged with the prominence and depression structure of the growth substrate. Also, the second concavoconvex portion 212 formed on the convex portion 211a of the first concavoconvex portion 211 may have non-periodical patterns, and as discussed above, the second concavoconvex portion 212 may be formed through wet etching, dry etching, or the process of performing both the wet etching and dry etching together. The first and second concavoconvex portions 211 and 212 may be formed to have periodical or non-periodical patterns, and in this case, when the first concavoconvex portion 211 has periodical patterns and the second concavoconvex portion 212 has non-periodical patterns, the light extraction efficiency can be further improved.

A first conductive type electrode (not shown) electrically connected to the first conductive type semiconductor layer 21 may be formed on the first and second concavoconvex portions 211 and 212. The first conductive type electrode may be formed on any portion of the first and second concavoconvex portions, but in order to evenly distribute current, the first conductive type electrode may be formed at a central portion of the first and second concavoconvex portions 211 and 212. Also, if the first conductive type electrode is formed at a portion overlapping with the prominences and depressions on the surface of the first and second concavoconvex portions 211 and 212, the contact surface of the first conductive type electrode has roughness due to the surface prominences and depressions, lowering electrical characteristics. Namely, a problem in that resistance of current introduced into the first conductive type semiconductor layer 21 through a second conductive type electrode increases may arise. Thus the first conductive type electrode is formed at portion that does not overlap with the prominence and depression patterns.

The protection layer 30 is formed in the concave portion 211b of the first concavoconvex portion 211 in order to prevent an etchant or gas from infiltrating into a portion (lattice dislocation bundle) of the first conductive type semiconductor layer 21 in forming the second concavoconvex portion 212, and efficiency in extracting external light can be enhanced owing to the difference in the index of refraction between the first conductive type semiconductor layer 21 and the protection layer 30. The remaining protection layer 30 may be made of a material having a high light transmittance and the index of refraction of 2.5 or lower to extract light, which has been emitted from the active layer 22 of the light emission structure 20, to the outside to thus improve the efficiency in extracting external light.

In detail, the protection layer 30 may serve to prevent an etchant from infiltrating into a portion (dislocation bundle) of the first conductive type semiconductor layer 21 where a crystal defect is generated in a follow-up additional patterning formation process. When the additional concavoconvex portion 212 is formed on the semiconductor layer having the first concavoconvex portion 211 formed thereon through wet etching, and the like, the etchant, or the like, would flow into the defective portion to degrade the quality of the semiconductor layer and cause a defective product. However, the formation of the protection layer 30 on the first concavoconvex portion 211 can prevent the infiltration of the etchant through the defective area of the first semiconductor layer 21 in the additional prominence and depression formation process.

The protection layer 30 may include an organic or inorganic compound having physical properties different from those of GaN. In detail, the protection layer 30 may be made of a silicon oxide such as $SiO_2$, silicon nitride formed of SiNx, $Al_2O_3$, HfO, $TiO_2$, ZrO, ZnO, indium oxide including an additive of at least one of Mg, Ag, Xn, Sc, Hf, Wr, Te, Se, Ta, W, Nb, Cu, Si, Ni, Co, Mo, Cr, Mn, Hg, Pr and La, through a process such as sputtering, deposition, or the like, known in the art.

Figure 10:
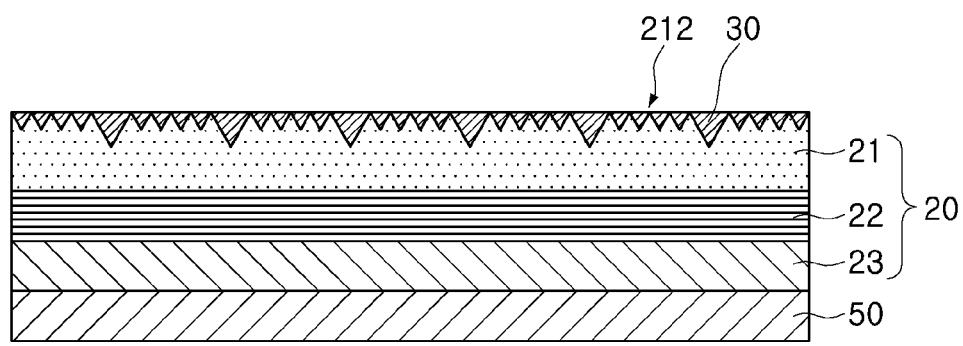
FIG. 10 is a side sectional view taken along line A-A' of the semiconductor LED of FIG. 9.

FIG. 10 is a side sectional view taken along line A-A' of the semiconductor LED of FIG. 9. A semiconductor LED 100 according to the present exemplary embodiment includes a conductive substrate 50 and the light emission structure 20 including the second conductive type semiconductor layer 23, the active layer 22, and the first conductive type semiconductor layer 21 sequentially formed on the conductive substrate 50. The first conductive type semiconductor layer 21 includes the first concavoconvex portion 211 having a plurality of convex portions 211a and concave portions 211b formed thereon and the second concavoconvex portion 212 formed on the convex portions 211a of the first concavoconvex portion 211. In the present exemplary embodiment, light emitted from the active layer 22 of the light emission structure 20 passes through the periodical first concavoconvex portion 211 and the non-periodical second concavoconvex portion 212, thus improving efficiency in extracting external light.

Figure 11:
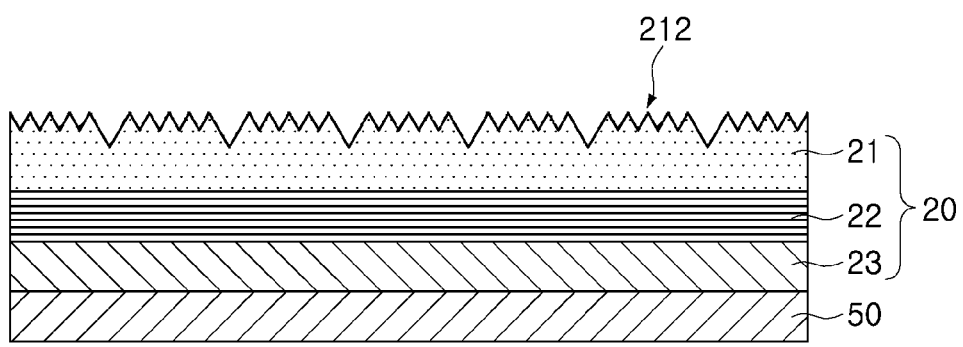
FIG. 11 is a side sectional view of the semiconductor LED according to another exemplary embodiment of the present invention.

FIG. 11 is a side sectional view of the semiconductor LED according to another exemplary embodiment of the present invention. In the present exemplary embodiment, unlike the exemplary embodiment illustrated in FIG. 10, the protection layer 30 filling up the concave portions 211b of the first concavoconvex portion 211 are removed to obtain a structure in which both the first and second concavoconvex portions 211 and 212 are exposed in the air. The protection layer 30 within the concave portions 211b of the first concavoconvex portion 211 may be removed by using HF, an etchant, or the like.

As set forth above, according to exemplary embodiments of the invention, in the process of forming the surface prominences and depressions, an etchant is prevented from being leaked into a defective portion within the semiconductor layer, thus improving the quality of the semiconductor LED. In addition, because the dual-pattern is formed, the efficiency in extracting external light of the semiconductor LED can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for manufacturing a semiconductor light emitting diode (LED), the method comprising:
    forming a light emission structure including a first conductive semiconductor layer, an active layer, and a second conductive semiconductor layer on a substrate with prominences and depressions;
    removing the substrate from the light emission structure to expose a first concavoconvex portion corresponding to the prominences and depressions;
    forming a protection layer on the first concavoconvex portion;
    removing a portion of the protection layer to expose a convex portion of the first concavoconvex portion; and
    forming a second concavoconvex portion on the convex portion of the first concavoconvex portion.

2. The method of claim 1, wherein in the removing of a portion of the protection layer, only the convex portion of the first concavoconvex portion is exposed.

3. The method of claim 1, wherein the size of the patterns of the second concavoconvex portion is smaller than that of the patterns of the first concavoconvex portion.

4. The method of claim 1, wherein the removing of a portion of the protection layer is performed by one of chemical mechanical polishing (CMP), wet etching, and dry etching.

5. The method of claim 1, wherein the removing of the substrate is performed through a laser lift-off process.

6. The method of claim 1, wherein the protection layer comprises at least one of silicon oxide and silicon nitride.

7. The method of claim 1, wherein the forming of the protection layer is performed by at least one of sputtering and a deposition process.

8. The method of claim 1, wherein the forming of the second concavoconvex portion is performed through wet etching.

9. The method of claim 8, wherein the wet etching is performed by using a KOH solution.

10. The method of claim 1, further comprising: removing the protection layer remaining in a concave portion of the first concavoconvex portion after the forming of the second concavoconvex portion.

11. The method of claim 10, wherein the removing of the protection layer remaining in the concave portion of the first concavoconvex portion is performed through a wet etching process using an HF solution.

12. The method of claim 1, further comprising:
    coating a photoresist on the surface of the protection layer to planarize the surface.

13. The method of claim 12, wherein the removing of a portion of the protection layer is removing of the photoresist and a portion of the protection layer to expose the convex portion of the first concavoconvex portion.

14. The method of claim 12, wherein the removing of the photoresist and a portion of the protection layer is performed through wet etching.

* * * * *